US012764855B2

(12) United States Patent
Li

(10) Patent No.: US 12,764,855 B2
(45) Date of Patent: Oct. 13, 2026

(54) BENDABLE CIRCUIT BOARD

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

(72) Inventor: Cheng-Jia Li, Shenzhen (CN)

(73) Assignees: HONGQISHENG PRECISION ELECTRONICS (QUINHUANGDAO) CO., LTD., Hebei Province (CN); AVARY HOLDING (SHENZHEN) CO., LTD., Shenzhen (CN); GARUDA TECHNOLOGY CO., LTD., New Taipei City (TW)

( * ) Notice: Subject to any disclaimer, the term of this patent is extended or adjusted under 35 U.S.C. 154(b) by 185 days.

(21) Appl. No.: 18/928,907

(22) Filed: Oct. 28, 2024

(65) Prior Publication Data

US 2026/0122778 A1 Apr. 30, 2026

(51) Int. Cl.

| | |
|---|---|
| ***H05K 1/02*** | (2006.01) |
| ***H05K 1/03*** | (2006.01) |
| ***H05K 1/09*** | (2006.01) |

(52) U.S. Cl.

CPC ......... *H05K 1/0283* (2013.01); *H05K 1/0393* (2013.01); *H05K 1/09* (2013.01); *H05K 2201/0314* (2013.01)

(58) Field of Classification Search

CPC ...... H05K 1/0283; H05K 1/0393; H05K 1/09; H05K 2201/0314

(Continued)

(56) References Cited

U.S. PATENT DOCUMENTS 6,376,769 B1 * 4/2002 Chung ...................... B32B 3/08 257/E23.07

11,582,389 B2 2/2023 Sommer (Continued)

FOREIGN PATENT DOCUMENTS

| | | | |
|---|---|---|---|
| CN | 116137757 | A | 5/2023 |
| TW | I797768 | B | 4/2023 |

*Primary Examiner* — Binh B Tran

(74) *Attorney, Agent, or Firm* — MUNCY, GEISSLER, OLDS & LOWE, P.C.

(57) ABSTRACT

A bendable circuit board includes a first structure and a second structure. The first structure includes a first insulation layer, a first insulation extension material, a first conductive layer and a first conductive extension feature. The first insulation extension material surrounds the first insulation layer. The first conductive layer includes a first conductive feature and a second conductive feature. The first conductive extension feature connects the first conductive feature to the second conductive feature. The second structure is bonded to the first structure, and includes a second insulation layer, a second insulation extension material, a second conductive layer and a second conductive extension feature. The second insulation extension material surrounds the second insulation layer. The second conductive layer includes a third conductive feature and a fourth conductive feature. The second conductive extension feature connects the third conductive feature to the fourth conductive feature.

15 Claims, 11 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2018/0102470 | A1* | 4/2018 | Das ......................... H01P 7/086 |
| 2021/0227689 | A1 | 7/2021 | Kimoto |
| 2024/0032189 | A1 | 1/2024 | Ozdoganlar et al. |

* cited by examiner

BENDABLE CIRCUIT BOARD

BACKGROUND

Field of Invention

The present invention relates to a bendable circuit board.

Description of Related Art

With the rapid development of electronic products, printed circuit boards (PCBs), which are used as a carrier for supporting components and transmission of electrical signals, gradually become miniaturized, lightweight, high-density and multifunctional. However, with the popularity of wearable devices, there are higher demands on the stress capacity of PCB circuits.

SUMMARY

According to some embodiments of the present disclosure, a bendable circuit board is provided. The bendable circuit board may adopt plural stretchable insulation materials, so that the bendable circuit board may have plural stretchable deformation areas in different directions, thus accordingly deforming the bendable circuit board when the bendable circuit board is subjected to a force. The bendable circuit board may adopt plural conductor materials and plural stretchable metal materials connected to the conductor materials, so that the bendable circuit board may have plural electrical network areas in different directions, thus remaining the electrical connection when the different structures of the bendable circuit board is deformed by the force. Furthermore, the top and bottom structures of the bendable circuit board have a cavity therebetween. By the design of the cavity, the bendable circuit board may have a deformation space and a stress relief space when the bendable circuit board is subjected to forces in different directions. In summary, with the design of the stretchable metal materials, stretchable materials and the cavity, the bendable circuit board has advantages of being resistant to bending and stretching. This design improves the tolerance for bending and arbitrary deformation, so that the bendable circuit board may be used under plural conditions, thus being applied in plural electronic fields.

According to some embodiments of the present disclosure, a bendable circuit board is provided. The bendable circuit board includes a first structure and a second structure. The first structure includes a first insulation layer, a first insulation extension material, a first conductive layer and a first conductive extension feature. The first insulation extension material surrounds the first insulation layer, in which an elongation rate of the first insulation extension material is greater than an elongation rate of the first insulation layer. The first conductive layer includes a first conductive feature and a second conductive feature, in which the first conductive feature is inside the first insulation layer, and the second conductive feature is inside the first insulation extension material. The first conductive extension feature extends along a horizontal direction, and connects the first conductive feature to the second conductive feature, in which an elongation rate of the first conductive extension feature is greater than an elongation rate of the first conductive layer. The second structure is bonded to the first structure along a vertical direction, in which the first structure and the second structure have a cavity therebetween, in which the second structure includes a second insulation layer, a second insulation extension material, a second conductive layer and a second conductive extension feature. The second insulation extension material surrounds the second insulation layer, in which an elongation rate of the second insulation extension material is greater than an elongation rate of the second insulation layer. The second conductive layer includes a third conductive feature and a fourth conductive feature, in which the third conductive feature is inside the second insulation layer, and the fourth conductive feature is inside the second insulation extension material. The second conductive extension feature extends along the horizontal direction, and connects the third conductive feature to the fourth conductive feature, in which an elongation rate of the second conductive extension feature is greater than an elongation rate of the second conductive layer.

According to some embodiments of the present disclosure, in which the first conductive layer includes a fifth conductive feature inside the first insulation layer, the fifth conductive feature is separated from the first conductive feature, and the fifth conductive feature is electrically disconnected from the second conductive feature.

According to some embodiments of the present disclosure, the bendable circuit board further includes a third conductive extension feature. The third conductive extension feature extends along the vertical direction and connecting the second conductive feature to the fourth conductive feature, in which an elongation rate of the third conductive extension feature is greater than the elongation rate of the first conductive layer or the elongation rate of the second conductive layer.

According to some embodiments of the present disclosure, in which the first conductive feature of the first conductive layer is misaligned with the third conductive feature of the second conductive layer along the vertical direction.

According to some embodiments of the present disclosure, in which the first conductive feature extends beyond a surface of the first insulation layer facing the cavity along the vertical direction.

According to some embodiments of the present disclosure, in which the first insulation layer extends beyond a surface of the first insulation extension material facing the cavity along the vertical direction.

According to some embodiments of the present disclosure, in which the first insulation layer extends beyond a surface of the first insulation extension material facing away from the cavity along the vertical direction.

According to some embodiments of the present disclosure, in which the first conductive extension feature is in direct contact with the first insulation layer and the first insulation extension material.

According to some embodiments of the present disclosure, in which the first insulation layer spaces the first insulation extension material apart from the first conductive feature.

According to some embodiments of the present disclosure, in which a thickness of the first conductive layer in the vertical direction is greater than a thickness of the first conductive extension feature in the vertical direction.

According to some embodiments of the present disclosure, in which the second conductive layer comprises a sixth conductive feature inside the second insulation layer, the sixth conductive feature is spaced apart from the third conductive feature, and the sixth conductive feature is electrically disconnected from the fourth conductive feature.

According to some embodiments of the present disclosure, in which the third conductive feature extends beyond a surface of the second insulation layer facing the cavity along the vertical direction.

According to some embodiments of the present disclosure, in which the second insulation layer extends beyond a surface of the second insulation extension material facing the cavity along the vertical direction.

According to some embodiments of the present disclosure, in which the second insulation layer extends beyond a surface of the second insulation extension material facing away from the cavity along the vertical direction.

According to some embodiments of the present disclosure, a bendable circuit board is provided. The bendable circuit board includes a first structure, a second structure and a third conductive extension feature. The first structure includes a first insulation layer, a first insulation extension material, a first conductive layer and a first conductive extension feature. The first insulation extension material surrounds the first insulation layer, in which an elongation rate of the first insulation extension material is greater than an elongation rate of the first insulation layer. The first conductive layer includes a first conductive feature and a second conductive feature, in which the first conductive feature is inside the first insulation layer, and the second conductive feature is inside the first insulation extension material. The first conductive extension feature extends along a horizontal direction, and connects the first conductive feature to the second conductive feature, in which an elongation rate of the first conductive extension feature is greater than an elongation rate of the first conductive layer. The second structure is bonded to the first structure along a vertical direction, in which the first structure and the second structure have a cavity therebetween, in which the second structure includes a second insulation layer, a second insulation extension material, a second conductive layer and a second conductive extension feature. The second insulation extension material surrounds the second insulation layer, in which an elongation rate of the second insulation extension material is greater than an elongation rate of the second insulation layer. The second conductive layer includes a third conductive feature and a fourth conductive feature, in which the third conductive feature is inside the second insulation layer, and the fourth conductive feature is inside the second insulation extension material. The second conductive extension feature extends along the horizontal direction, and connects the third conductive feature to the fourth conductive feature, in which an elongation rate of the second conductive extension feature is greater than an elongation rate of the second conductive layer. The third conductive extension feature extends along the vertical direction and connecting the second conductive feature to the fourth conductive feature.

DETAILED DESCRIPTION

The embodiments of the present disclosure are discussed in detail below. However, it should be understood that the embodiments provide many applicable concepts that can be implemented in a wide variety of specific contexts. The embodiments discussed and disclosed are for illustrative purposes only and are not intended to limit the scope of the present disclosure. As used herein, the terms 'first', 'second', etc., do not specifically refer to order or sequence, but are intended only to distinguish components or operations that are described in the same technical terms.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Figure 1:
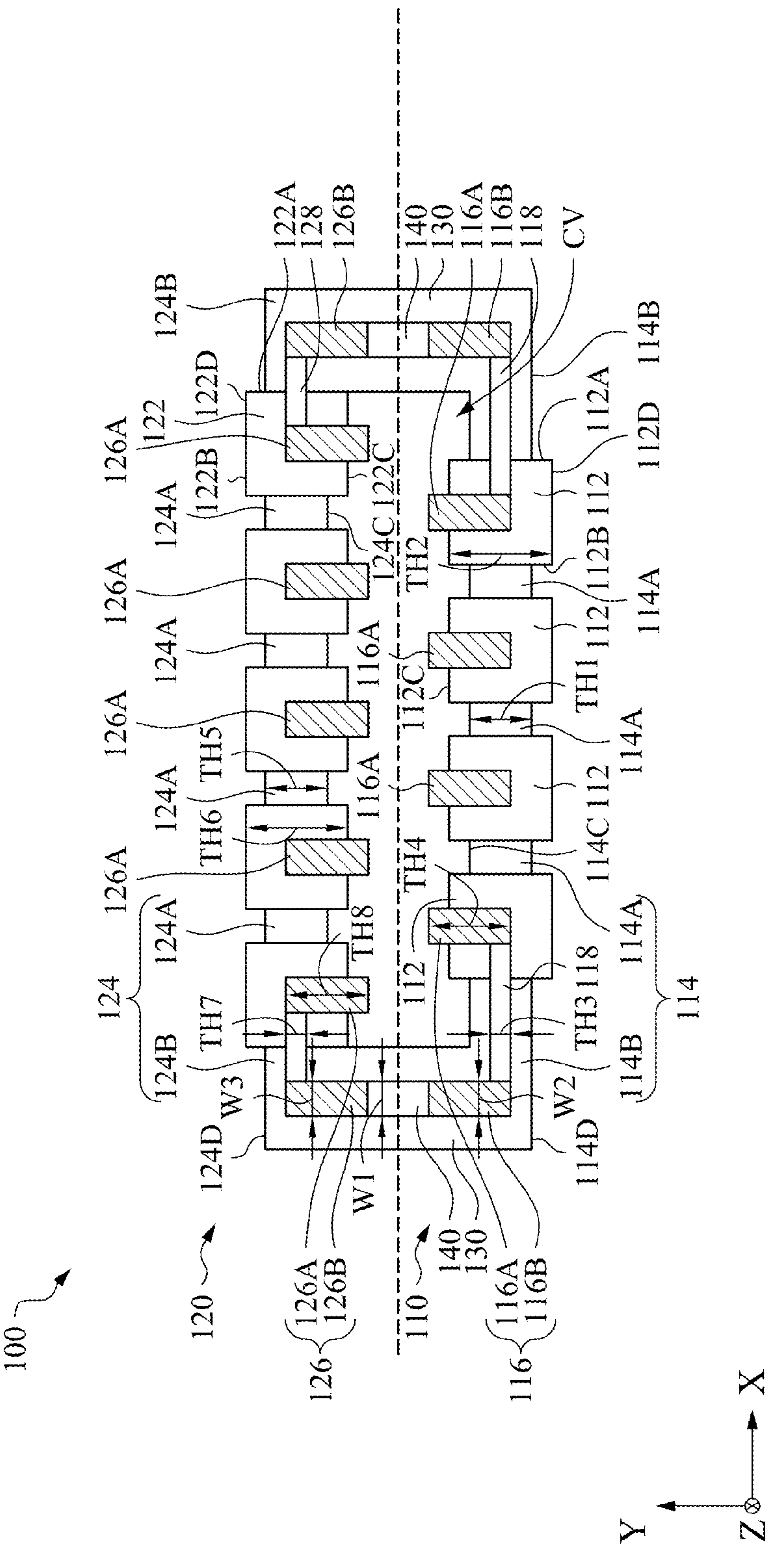
FIG. 1 is a schematic diagram of a bendable circuit board in accordance with some embodiments of the present disclosure.

FIG. 1 is a schematic diagram of a bendable circuit board 100 in accordance with some embodiments of the present disclosure. Refer to FIG. 1. The bendable circuit board 100 includes structures 110 and 120, a stretchable adhesive layer 130 and a conductive extension feature 140, in which the structures 110 and120 have a cavity therebetween. The cavity is designed to facilitate the bendable circuit board 100 to have a deformation space and a stress relief space when the bendable circuit board 100 is subjected to forces in direction X, Y or Z, so that the bendable circuit board 100 may be deformed by stretching, compressing, twisting and so on.

In some embodiments, the structure 110 includes an insulation layer 112, an insulation extension material 114, a conductive layer 116 and a conductive extension feature 118.

In some embodiments, the insulation layer 112 may be formed by organic or inorganic insulation materials, so that the insulation layer 112 may provide a mechanical support or electrical isolations between the conduction paths for the bendable circuit board 100, thus avoiding short circuits and maintaining signal integrity. For example, in some embodiments, the insulation layer 112 may be formed by a phenol formaldehyde resins (PF), an Epoxy, a FR-4, a CEM-3, a polyimide (PI), an ink, similar materials or combination thereof.

In some embodiments, the insulation extension material 114 may be materials with high mechanical ductility, in which the materials may remain great electrical isolation properties when the materials are deformed under forces (such as stretching and bending), so that the bendable circuit board 100 may avoid impacts of the short circuits or other malfunctions during the deformation. For example, in some embodiments, the insulation extension material 114 may be a silicone rubber, a polydimethylsiloxane (PDMS), a thermoplastic polyurethane (TPU), an elastomer compound, an elastomer composite, similar materials or combination thereof, in which the elastomer compound and elastomer composite may be mixed an insulation polymer (such as a polyurethane (PU)), a vinyl polymer, similar materials or combination thereof with a conductive filler (such as a carbon nanotube, a Ag nanowire, similar materials or combination thereof). Thus, an elongation rate of the insulation extension material 114 may greater than an elongation rate of the insulation layer 112, in which the elongation rate is a degree of deformation of an object which is subjected to a force. For example, in some embodiments, the elongation rate of the insulation extension material 114 may between 100% and 600%, and the elongation rate of the insulation layer 112 may be less than or equal to 2%.

In some embodiments, the insulation extension material 114 may surrounds the insulation layer 112. For example, in the present embodiment, a portion 114A of the insulation extension material 114 is between the insulation layer 112 and in direct contact with opposite surfaces 112A and 112B of the insulation layer 112. A portion 114B of the insulation extension material 114 may be on the surfaces 112A or 112B of the insulation layer 112, and in contact with the stretchable adhesive layer 130. In the direction X, a center line of the insulation extension material 114 is aligned with a center line of the insulation layer 112, so that the bendable circuit board 100 has a configuration similar to a concave-convex structure.

Furthermore, a thickness TH1 of the insulation extension material 114 may be adjusted according to a functional requirement. For example, in some embodiments, the thickness TH1 of the insulation extension material 114 is less than or equal to 2 times a thickness TH2 of the insulation layer 112. Therefore, the insulation layer 112 extends beyond a surface 114C of the insulation extension material 114 facing the cavity CV along the vertical direction (i.e., A direction Y) (i.e., a surface 112C of the insulation layer 112 is higher than the surface 114C of the insulation extension material 114 along the direction Y), and the insulation layer 112 extends beyond a surface 114D of the insulation extension material 114 facing away from the cavity CV along the vertical direction (i.e., A direction Y) (i.e., a surface 112D of the insulation layer 112 is lower than the surface 114D of the insulation extension material 114 along the direction Y).

In some embodiments, the conductive layer 116 includes conductive features 116A and 116B, in which the conductive feature 116A and 116B are substantially the same. The conductive layer 116 may adopt copper, tin, silver, nickel, similar conductive materials or combination thereof. The conductive feature 116A is inside the insulation layer 112, in which the insulation layer 112 may spaces the insulation extension material 114 apart from the conductive feature 116A. The conductive feature 116B is inside the portion 114B of the insulation extension material 114 and the stretchable adhesive layer 130, and separated from the conductive feature 116A. A portion of the conductive feature 116A is inside the insulation layer 112. Another portion of the conductive feature 116A extends beyond the surface 112C of the insulation layer 112 facing the cavity CV along the vertical direction (i.e., the direction Y) (i.e., the portion of the conductive feature 116A protrudes to the cavity CV along the direction Y). A length of the protruding portion of the conductive feature 116A is less than one third of a length of the conductive feature 116A, so that the bendable circuit board 100 may be continuously conducted and the voltage of the bendable circuit board 100 may be maintained stable. In addition, some of the conductive features 116A are electrically disconnected from the conductive features 116B.

In some embodiments, the conductive extension feature 118 may be materials with good electrical conductivity, adhesion and stretchability, so that the bendable circuit board 100 may remain the electrical connection during the deformation. For example, in the present embodiment, the conductive extension feature 118 may be a conductive silver paste, similar materials or combination thereof, in which an elongation rate of the conductive silver paste is between 100% and 500%. Thus, an elongation rate of the conductive extension feature 118 is higher than the conductive layer 116.

In some embodiments, the conductive extension feature 118 is disposed in the insulation layer 112 and the portion 114B of the insulation extension material 114. For example, in the present embodiment, the conductive extension feature 118 may be disposed between the conductive features 116A and 116B. The conductive extension feature 118 may extend along a horizontal direction (i.e., a direction X), and connect a bottom end of the conductive feature 116A to a bottom end of the conductive feature 116B, in which the conductive extension feature 118 is in direct contact with the insulation layer 112 and the portion 114B of the insulation extension material 114. Furthermore, a thickness of the conductive extension feature 118 may be adjusted according to the functional requirement. For example, in present embodiment, a thickness TH3 of the conductive extension feature 118 in the vertical direction (i.e., a direction Y) is less than a thickness TH4 of the conductive feature 116A in the vertical direction (i.e., a direction Y).

In some embodiments, the structure 120 is bonded to the structure 110 along the vertical direction (i.e., a direction Y). The structure 120 includes an insulation layer 122, an insulation extension material 124, a conductive layer 126 and a conductive extension feature 128.

In some embodiments, the insulation layer 122 may be formed by organic or inorganic insulation materials, so that the insulation layer 122 may provide a mechanical support or electrical isolations between the conduction paths for the bendable circuit board 100, thus avoiding short circuits and maintaining signal integrity. For example, in some embodiments, the insulation layer 122 may be formed by a phenol formaldehyde resins (PF), an Epoxy, a FR-4, a CEM-3, a polyimide (PI), an ink, similar materials or combination thereof. In addition, the insulation layer 122 is misaligned with the insulation layer 112 of the structure 110 along the vertical direction (i.e., a direction Y).

In some embodiments, the insulation extension material 124 may be materials with high mechanical ductility, in which the materials may remain great electrical isolation properties when the materials are deformed under forces (such as stretching and bending), so that the bendable circuit board 100 may avoid impacts of the short circuits or other malfunctions during the deformation. For example, in some embodiments, the insulation extension material 124 may be a silicone rubber, a polydimethylsiloxane (PDMS), a thermoplastic polyurethane (TPU), an elastomer compound, an elastomer composite, similar materials or combination thereof, in which the elastomer compound and elastomer composite may be mixed an insulation polymer (such as a polyurethane (PU)), a vinyl polymer, similar materials or combination thereof with a conductive filler (such as a carbon nanotube, a Ag nanowire, similar materials or combination thereof). Thus, an elongation rate of the insulation extension material 124 may greater than an elongation rate of the insulation layer 122. For example, in some embodiments, the elongation rate of the insulation extension material 124 may between 100% and 600%, and the elongation rate of the insulation layer 122 may be less than or equal to 2%.

In some embodiments, the insulation extension material 124 may surrounds the insulation layer 122. For example, in the present embodiment, a portion 124A of the insulation extension material 124 is between the insulation layer 122 and in direct contact with opposite surfaces 122A and 122B of the insulation layer 122. A portion 124B of the insulation extension material 124 may be on the surfaces 122A or 122B of the insulation layer 122, and in contact with the stretchable adhesive layer 130. In the direction X, a center line of the insulation extension material 124 is aligned with a center line of the insulation layer 122, so that the bendable circuit board 100 has a configuration similar to a concave-convex structure.

Furthermore, a thickness TH5 of the insulation extension material 124 may be adjusted according to a functional requirement. For example, in some embodiments, the thickness TH5 of the insulation extension material 124 is less than or equal to 2 times a thickness TH6 of the insulation layer 122. Therefore, the insulation layer 122 extends beyond a surface 124C of the insulation extension material 124 facing the cavity CV along the vertical direction (i.e., the direction Y) (i.e., a surface 122C of the insulation layer 122 is higher than the surface 124C of the insulation extension material 124 along the direction Y), and the insulation layer 122 extends beyond a surface 124D of the insulation extension material 124 facing away from the cavity CV along the vertical direction (i.e., the direction Y) (i.e., a surface 122D of the insulation layer 122 is lower than the surface 124D of the insulation extension material 124 along the direction Y).

In some embodiments, the conductive layer 126 includes conductive features 126A and 126B, in which the conductive feature 126A and 126B are substantially the same. The conductive layer 126 may adopt copper, tin, silver, nickel, similar conductive materials or combination thereof. The conductive feature 126A is inside the insulation layer 122, in which the insulation layer 122 may space the insulation extension material 124 apart from the conductive feature 126A. The conductive feature 126B is inside the portion 124B of the insulation extension material 124 and the stretchable adhesive layer 130, and separated from the conductive feature 126A. A portion of the conductive feature 126A is inside the insulation layer 122. Another portion of the conductive feature 126A extends beyond the surface 122C of the insulation layer 122 facing the cavity CV along the vertical direction (i.e., the direction Y) (i.e., the portion of the conductive feature 126A protrudes to the cavity CV along the direction Y). A length of the protruding portion of the conductive feature 126A is less than one third of a length of the conductive feature 126A, so that the bendable circuit board 100 may be continuously conducted and the voltage of the bendable circuit board 100 may be maintained stable. In addition, the conductive feature 126A of the conductive layer 126 is misaligned with the conductive features 116A of the conductive layer 116 along the vertical direction (i.e., the direction Y). The conductive feature 126B of the conductive layer 126 is aligned with the conductive features 116B of the conductive layer 116 along the vertical direction (i.e., the direction Y).

In some embodiments, the conductive extension feature 128 may be materials with good electrical conductivity, adhesion and stretchability, so that the bendable circuit board 100 may remain the electrical connection during the deformation. For example, in the present embodiment, the conductive extension feature 128 may be a conductive silver paste, similar materials or combination thereof, in which an elongation rate of the conductive silver paste is between 100% and 500%. Thus, an elongation rate of the conductive extension feature 128 is higher than the conductive layer 126.

In some embodiments, the conductive extension feature 128 is disposed in the insulation layer 122 and the portion 124B of the insulation extension material 124. For example, in the present embodiment, the conductive extension feature 128 may be disposed between the conductive features 126A and 126B. The conductive extension feature 128 may extend along a horizontal direction (i.e., a direction X), and connect a top end of the conductive feature 126A to a top end of the conductive feature 126B, in which the conductive extension feature 128 is in direct contact with the insulation layer 122 and the portion 124B of the insulation extension material 124. Furthermore, a thickness of the conductive extension feature 128 may be adjusted according to a functional requirement. For example, in present embodiment, a thickness TH7 of the conductive extension feature 128 in the vertical direction (i.e., the direction Y) is less than a thickness TH8 of the conductive feature 126A in the vertical direction (i.e., the direction Y).

In some embodiments, the stretchable adhesive layer 130 may adopt materials similar to the insulation extension material 114 of the structure 110 or the insulation extension material 124 of the structure 120. For example, in the present embodiment, the stretchable adhesive layer 130 may be a silicone rubber, a PDMS, a TPU, an elastomer compound, an elastomer composite, similar materials or combination thereof. The stretchable adhesive layer 130 may be disposed between the portion 114B of the insulation extension material 114 of the structure 110 and the portion 124B of the insulation extension material 124 of the structure 120, so that the stretchable adhesive layer 130 connects the structure 110 to the structure 120.

In some embodiments, the conductive extension feature 140 may adopt materials similar to the conductive extension feature 118 of the structure 110 or the conductive extension feature 128 of the structure 120, and a elongation rate of the conductive extension feature 140 is greater than the elongation rate of the conductive layer 116 or the elongation rate of the conductive layer 126. For example, in the present embodiment, the conductive extension feature 140 may be the conductive silver paste, similar materials or combination thereof.

In some embodiments, the conductive extension feature 140 is disposed in the stretchable adhesive layer 130. For example, in the present embodiment, the conductive extension feature 140 may be disposed between the conductive feature 116B of the structure 110 and the conductive feature 126B of the structure 120. The conductive extension feature 140 may extend along the vertical direction (i.e., the direction Y), and connect the conductive feature 116B to the conductive feature 126B, so that the structure 110 is electrically connected to the structure 120, in which the conductive extension feature 140 is in direct contact with the stretchable adhesive layer 130, the conductive feature 116B and 126B. Furthermore, a width of the conductive extension feature 140 may be adjusted according to a functional requirement. For example, in present embodiment, a width W1 of the conductive extension feature 140 in the horizontal direction (i.e., the direction X) is substantially the same as a width W2 of the conductive feature 116B in the horizontal direction (i.e., the direction X) and a width W3 of the conductive feature 126B in the horizontal direction (i.e., the direction X).

In addition, in some embodiments, the conductive feature 116A and the insulation layer 112 may be an electrical network area of the structure 110 in the horizontal direction (i.e., the direction X), and the portion 114A of the insulation extension material 114 may be a stretchable deformation area of the structure 110 in the horizontal direction (i.e., the direction X), so that the structure 110 may be deformed and remain the electrical connection when the structure 110 is subjected to a force in the horizontal direction (i.e., the direction X). The conductive feature 126A and the insulation layer 122 may be an electrical network area of the structure 120 in the horizontal direction (i.e., the direction X), and the portion 124A of the insulation extension material 124 may be a stretchable deformation area of the structure 120 in the horizontal direction (i.e., the direction X), so that the structure 120 may be deformed and remain the electrical connection when the structure 120 is subjected to a force in the horizontal direction (i.e., the direction X). The conductive features 166B and 126B, the portion 114B of the insulation extension material 114, the portion 124B of the insulation extension material 124, the stretchable adhesive layer 130 and the conductive extension feature 140 may be an electrical network area and an stretchable deformation area of the bendable circuit board 100 in the vertical direction (i.e., the direction Y), so that the bendable circuit board 100 may be deformed and remain the electrical connection when the bendable circuit board 100 is subjected to a force in the vertical direction (i.e., the direction Y). Thus, the bendable circuit board 100 may have electrical network areas and an stretchable deformation areas in the horizontal direction (i.e., the direction X) and the vertical direction (i.e., the direction Y), and the bendable circuit board 100 may be accordingly deformed under various force states (such as elongation, compression and spin) without affecting functions of the bendable circuit board 100, in which the electrical network area and an stretchable deformation area of the bendable circuit board 100 in the vertical direction (i.e., the direction Y) may be served as a stiffener structure.

Figure 2A:
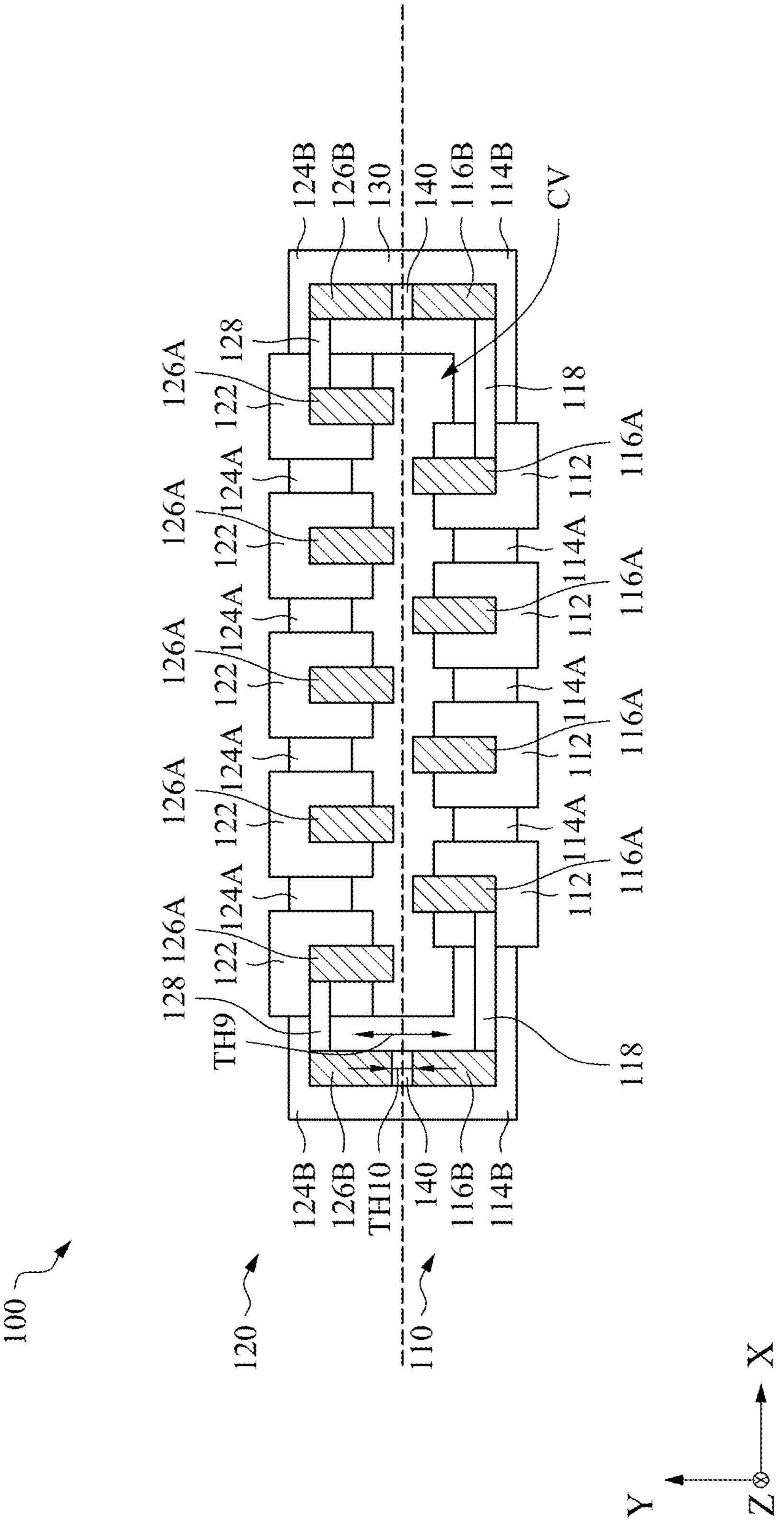
FIG. 2A is a schematic diagram of the bendable circuit board in FIG. 1 when the bendable circuit board is compressed by a force in the vertical direction.

FIG. 2A is a schematic diagram of the bendable circuit board 100 in FIG. 1 when the bendable circuit board 100 is compressed by a force in the vertical direction. Refer to FIG. 2A. In some embodiments, when the bendable circuit board 100 is compressed by a force in the vertical direction (i.e., the direction Y), the stretchable adhesive layer 130 and the conductive extension feature 140 are accordingly compressed, so that a thickness TH9 of the stretchable adhesive layer 130 and a thickness TH10 of the conductive extension feature 140 are accordingly reduced. The structures 110 and 120 are compressed towards the cavity CV along the force direction, so that a width of the cavity CV is reduced, thus deforming the bendable circuit board 100, in which the cavity CV is the deformation space and the stress relief space.

Figure 2B:
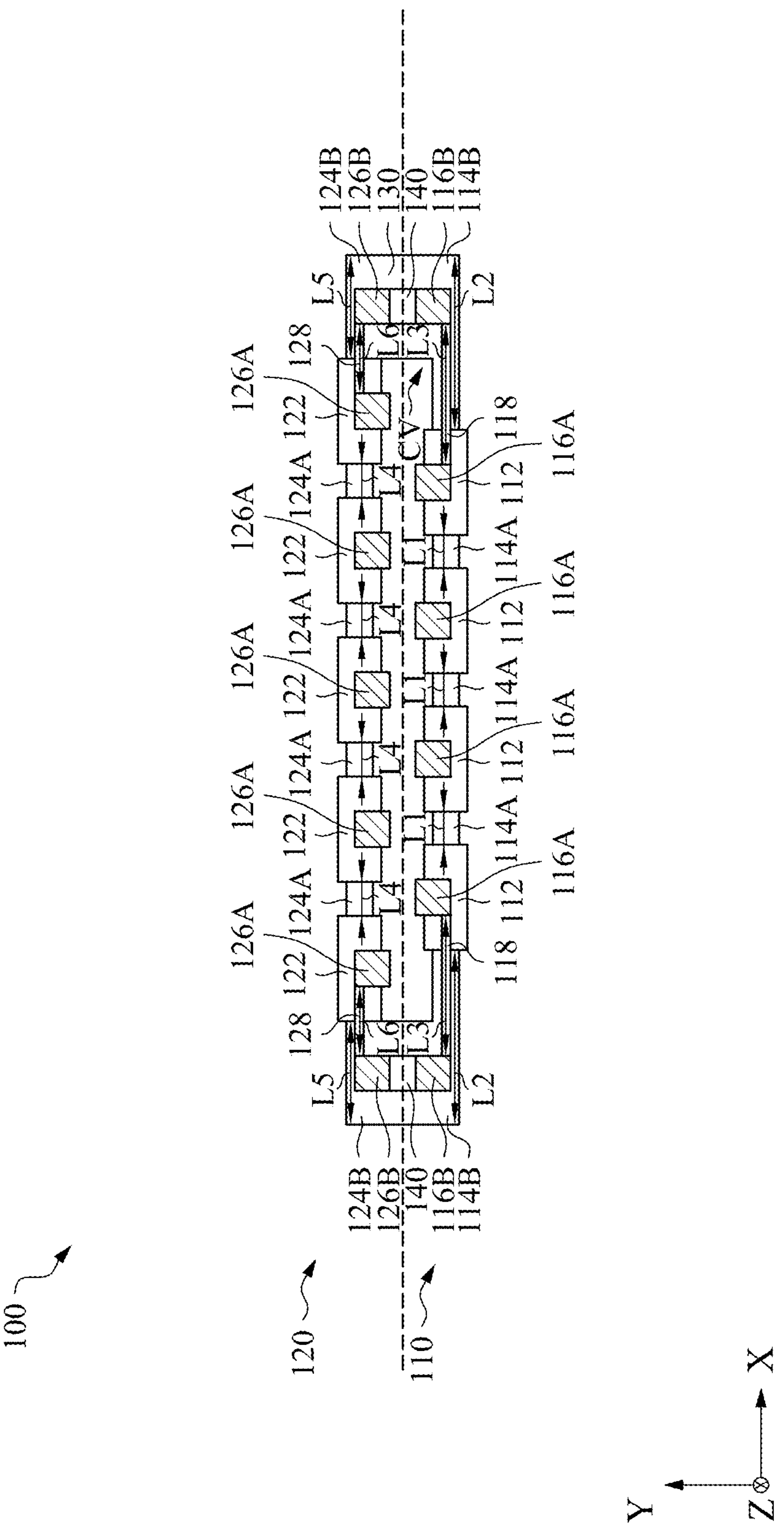
FIG. 2B is a schematic diagram of the bendable circuit board in FIG. 1 when the bendable circuit board is stretched by a force in the horizontal direction.

FIG. 2B is a schematic diagram of the bendable circuit board 100 in FIG. 1 when the bendable circuit board 100 is stretched by a force in the horizontal direction. Refer to FIG. 2B. In some embodiments, when the bendable circuit board 100 is stretched by a force in the horizontal direction (i.e., the direction X), the portions 114A and 114B of the insulation extension material 114 and the conductive extension feature 118 are accordingly stretched, so that a length L1 of the portion 114A, length L2 of the portion 114B and length L3 of the conductive extension feature 118 are accordingly increased. The portions 124A and 124B of the insulation extension material 124 and the conductive extension feature 128 are accordingly stretched, so that a length L4 of the portion 124A, length L5 of the portion 124B and length L6 of the conductive extension feature 128 are accordingly increased. The structures 110 and 120 are stretched along the force direction, so that a length of the cavity CV is increased, thus deforming the bendable circuit board 100, in which the cavity CV is the deformation space and the stress relief space.

Figure 2C:
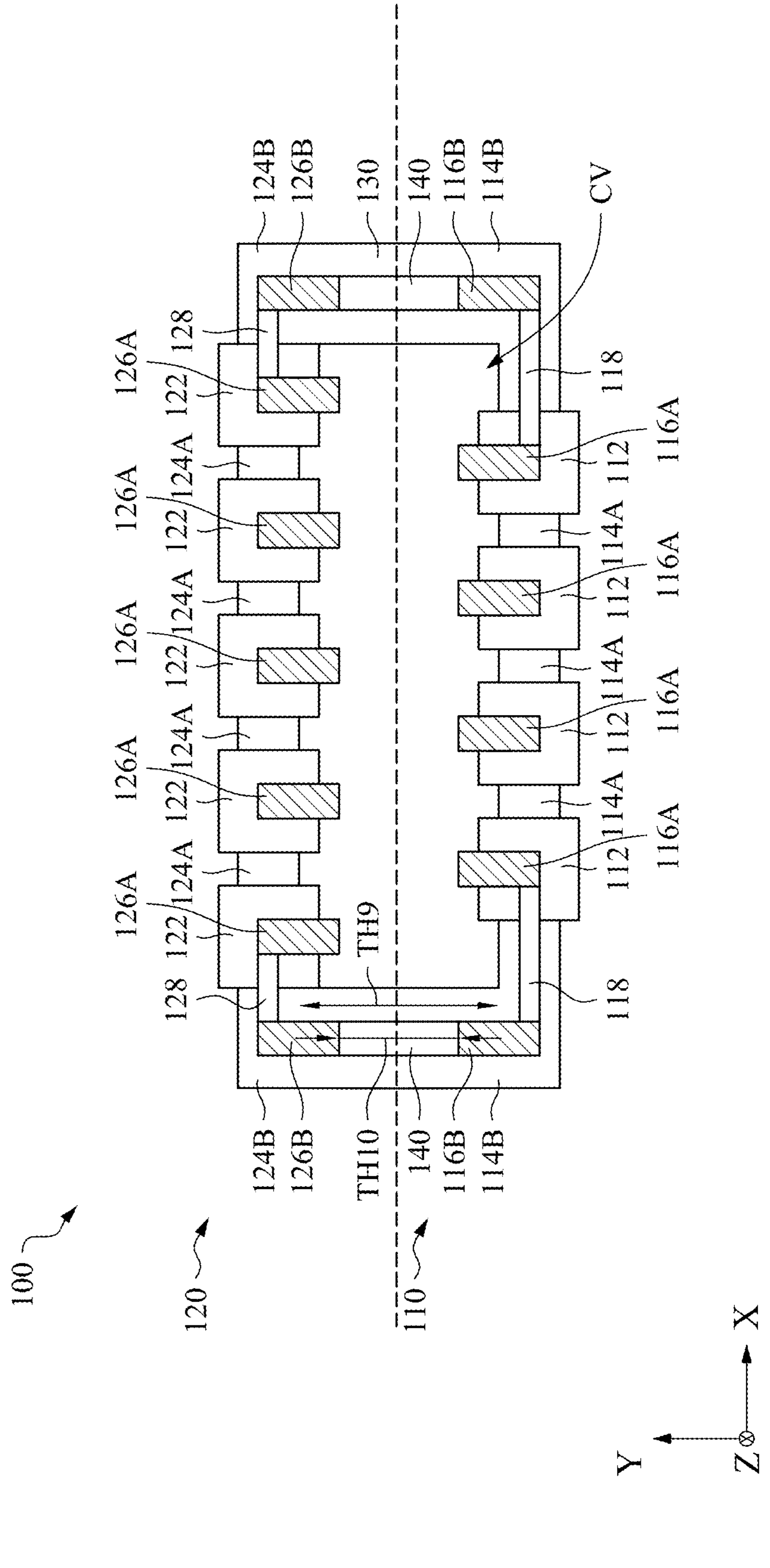
FIG. 2C is a schematic diagram of the bendable circuit board in FIG. 1 when the bendable circuit board is stretched by a force in the vertical direction.

FIG. 2C is a schematic diagram of the bendable circuit board 100 in FIG. 1 when the bendable circuit board 100 is stretched by a force in the vertical direction. Refer to FIG. 2C. In some embodiments, when the bendable circuit board 100 is stretched by a force in the vertical direction (i.e., the direction Y), the stretchable adhesive layer 130 and the conductive extension feature 140 are accordingly stretched, so that the thickness TH9 of the stretchable adhesive layer 130 and the thickness TH10 of the conductive extension feature 140 are accordingly increased. The structures 110 and 120 are stretched along the force direction, so that the width of the cavity CV is increased, thus deforming the bendable circuit board 100, in which the cavity CV is the deformation space and the stress relief space.

Figure 3:
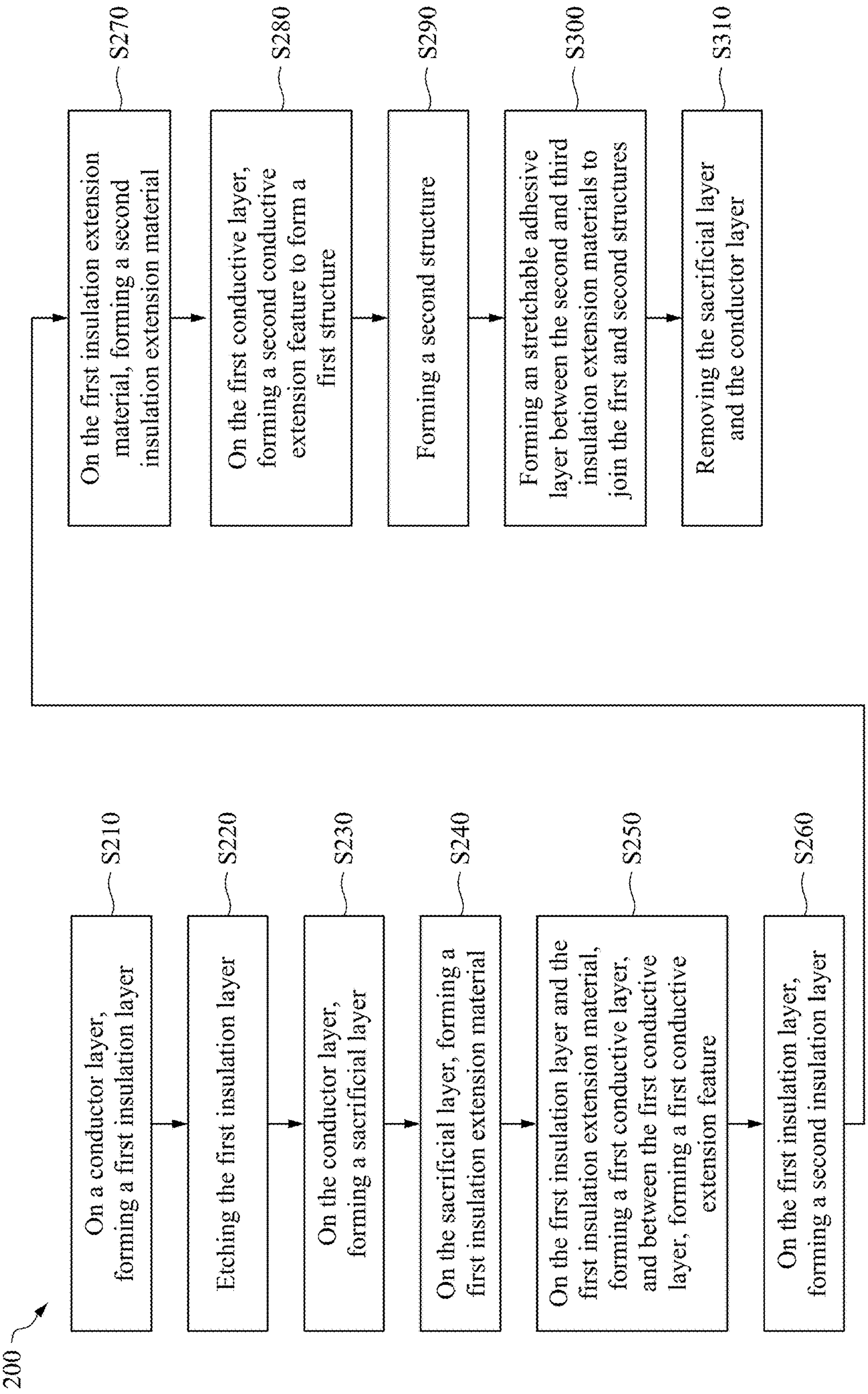
FIG. 3 is a flow chart of a method for fabricating a bendable circuit board in accordance with some embodiments of the present disclosure.

FIG. 3 is a flow chart of a method 200 for fabricating a bendable circuit board 100 in accordance with some embodiments of the present disclosure. The illustration is merely exemplary and is not intended to limit beyond what is specifically recited in the claims that follow. The method 200 includes steps S210~S310. It should be understood that additional steps may be provided before, during and after steps S210~S310, and that some of the steps described below may be replaced or eliminated for another embodiment of the method. The order of steps/programs can be interchangeable.

FIGS. 4A through 4K are cross-sectional views of a bendable circuit board 100 at various stages of process in accordance with one example of the present disclosure. First, refer to the FIGS. 3 and 4A. The method 200 proceeds to step S210. On a conductor layer 900, an insulation layer 800' is formed, in which the conductor layer 900 includes copper. For example, in the present embodiment, the insulation layer 800' may include materials similar as the insulation layers 112 and 122 (referring to FIG. 1). The insulation layer 800' may be formed on a surface 900A of the conductor layer 900 by a printing process.

Figure 4A:
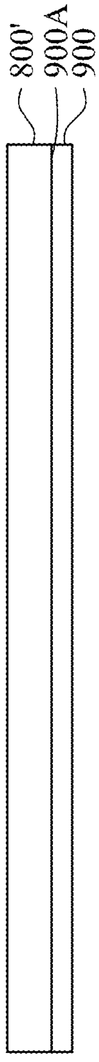
FIGS. 4A through 4K are cross-sectional views of a bendable circuit board at various stages of process in accordance with one example of the present disclosure.
Figure 4B:
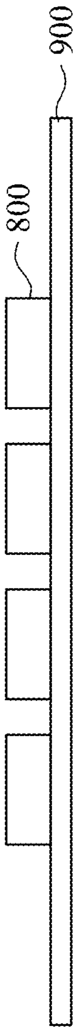

Following, refer to the FIGS. 3 and 4B. The method 200 proceeds to step S220. An etching process is performed to the insulation layer 800'. For example, in the present embodiment, a chemical etching process, a physical etching process, a composite etching process, similar etching processes or combination thereof may be performed to the insulation layer 800' to form the insulation layer 800.

Figure 4C:
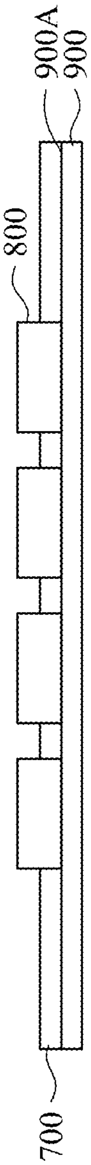

Following, refer to the FIGS. 3 and 4C. The method 200 proceeds to step S230. On the conductor layer 900, a sacrificial layer 700 is formed. For example, in the present embodiment, the sacrificial layer 700 is formed on the surface 900A of the conductor layer 900 by a printing process, and the sacrificial layer 700 is between the insulation layers 800. In some embodiments, the printing process includes a spin coating process, an inkjet printing process, a flexography process, a plate printing process, similar printing processes or combination thereof.

Figure 4D:
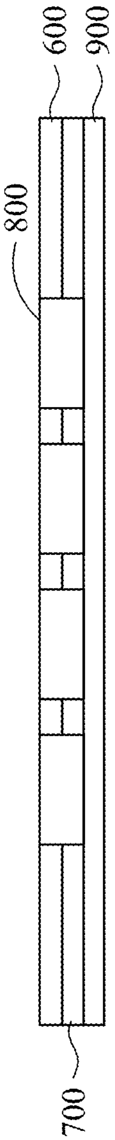

Following, refer to the FIGS. 3 and 4D. The method 200 proceeds to step S240. On the sacrificial layer 700, an insulation extension material 600 in formed. For example, in the present embodiment, the insulation extension material 600 includes materials similar as the insulation extension material 114 and 124 (referring to FIG. 1). The insulation extension material 600 may be formed on the sacrificial layer 700 by a printing process, and the sacrificial layer 700 is between the insulation layers 800. In some embodiments, the printing process includes a screen-printing process, an inkjet printing process, an intaglio printing process, similar printing processes or combination thereof.

Figure 4E:
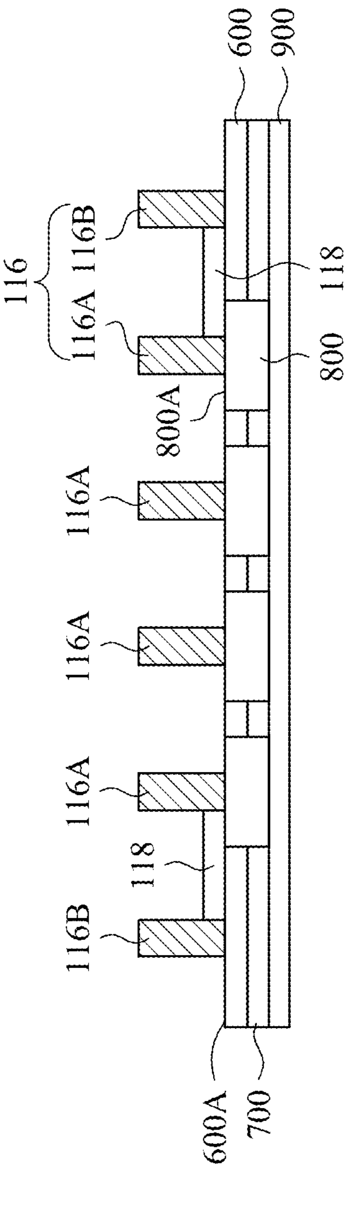

Following, refer to the FIGS. 3 and 4E. The method 200 proceeds to step S250. On the insulation layers 800 and the insulation extension material 600, the conductive layer 116 is formed, and the conductive extension feature 118 is formed between the conductive features 116A and 116B of the conductive layer 116. For example, in the present embodiment, the conductive features 116A and 116B of the conductive layer 116 are respectively formed on a surface 800A of the insulation layer 800 and a surface 600A of the insulation extension material 600 by a printing process including a spin coating process, an inkjet printing process, a flexography process, a plate printing process, similar printing processes or combination thereof. The conductive extension feature 118 is formed between the conductive features 116A and 116B by a printing process including a screen printing process, an inkjet printing process, an intaglio printing process, similar printing processes or combination thereof, in which the conductive extension feature 118 is in contact with the conductive features 116A and 116B, and the conductive extension feature 118 connected to the conductive features 116A and 116B.

Figure 4F:
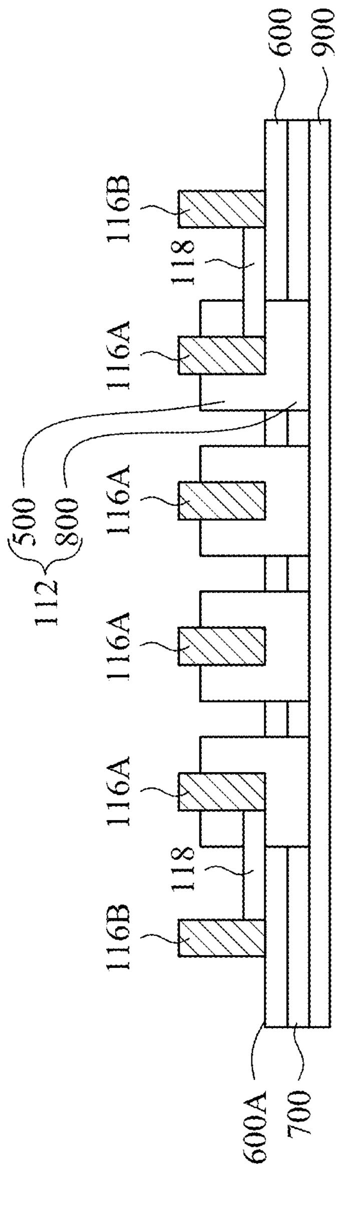

Following, refer to the FIGS. 3 and 4F. The method 200 proceeds to step S260. On the insulation layer 800, an insulation layer 500 is formed. For example, in the present embodiment, the insulation layer 500 may include materials similar as the insulation layers 112 and 122 (referring to FIG. 1). The insulation layer 500 is formed on a surface 800A (referring to FIG. 4E) of the insulation layer 800 by a spin coating process, an inkjet printing process, a flexography process, a plate printing process, similar printing processes or combination thereof. The insulation layer 500 surrounds part of the conductive feature116A, and covers part of the conductive extension feature 118.

Figure 4G:
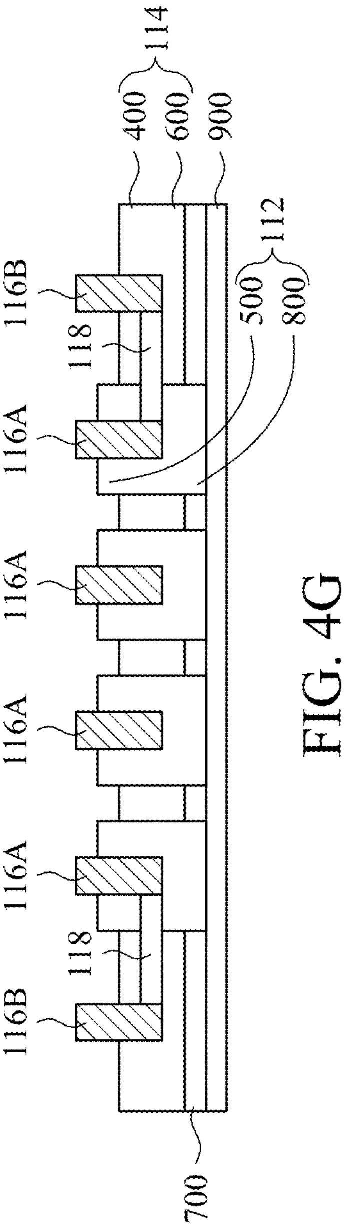

Following, refer to the FIGS. 3 and 4G. The method 200 proceeds to step S270. On the insulation extension material 600, an insulation extension material 400 is formed. The insulation extension material 400 is formed on the surface 600A of the insulation extension material 600 by a screen printing process, an inkjet printing process, an intaglio printing process, similar printing processes or combination thereof, and covers part of the conductive extension feature 118, in which the insulation extension materials 400 and 600 are collectively referred to as the insulation extension material 114.

Figure 4H:
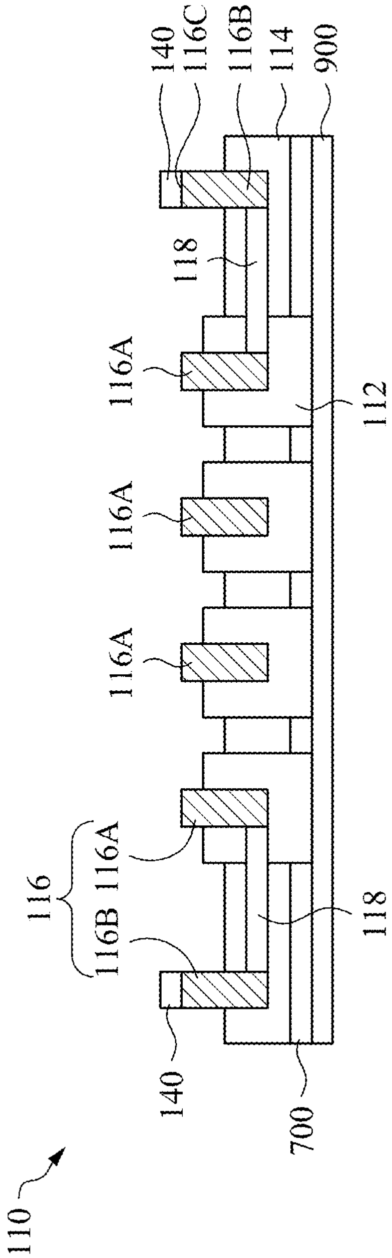

Following, refer to the FIGS. 3 and 4H. The method 200 proceeds to step S280. On the conductive layer 116, the conductive extension feature 140 is formed to form the structure 110. For example, in the present embodiment, the conductive extension feature 140 is formed on the surface 116C of the conductive feature 116B of the conductive layer 116 by a screen printing process, an inkjet printing process, an intaglio printing process, similar printing processes or combination thereof. Thus, the structure 110 is formed.

Figure 4I:
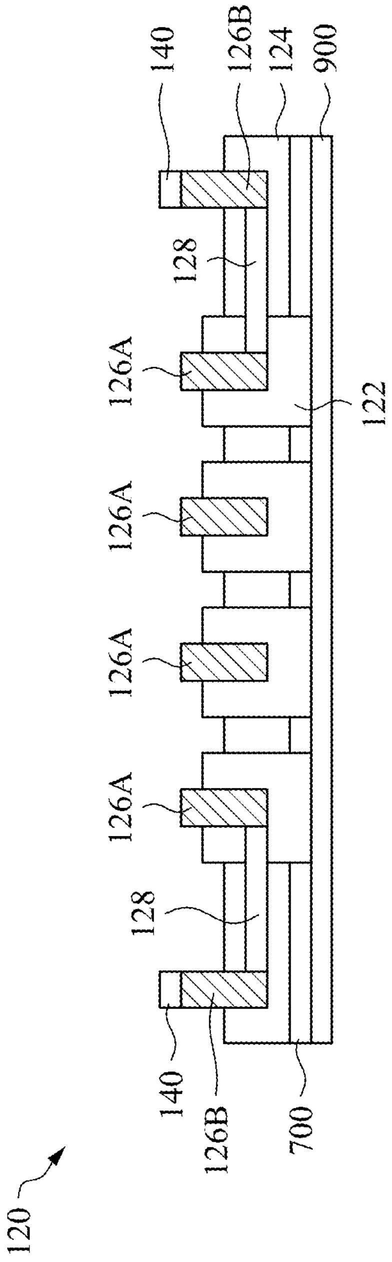

Following, refer to the FIGS. 3 and 4I. The method 200 proceeds to step S290. The structure 120 is formed. For example, in some embodiment, the structure 120 may be simultaneity fabricated by the steps similar to the structure 110 (i.e., the above steps S210~S280). The insulation layer 122 is formed on the conductor layer 900. The sacrificial layer 700 is formed on the conductor layer 900. The insulation extension material 124 is formed on the sacrificial layer 700. The conductive feature 126A is formed in the insulation layer 122. The conductive feature 126B is formed in the insulation extension material 124. The conductive extension feature 128 is formed between the conductive features 126A and 126B. The conductive extension feature 140 is formed on the conductive feature 126B.

In another embodiment, the structure 120 may be separately fabricated by the steps similar to the structure 110 (i.e., the above steps S210~S280), in which the present embodiment is similar to the above embodiment, and therefore the present embodiment is not repeated here.

Figure 4J:
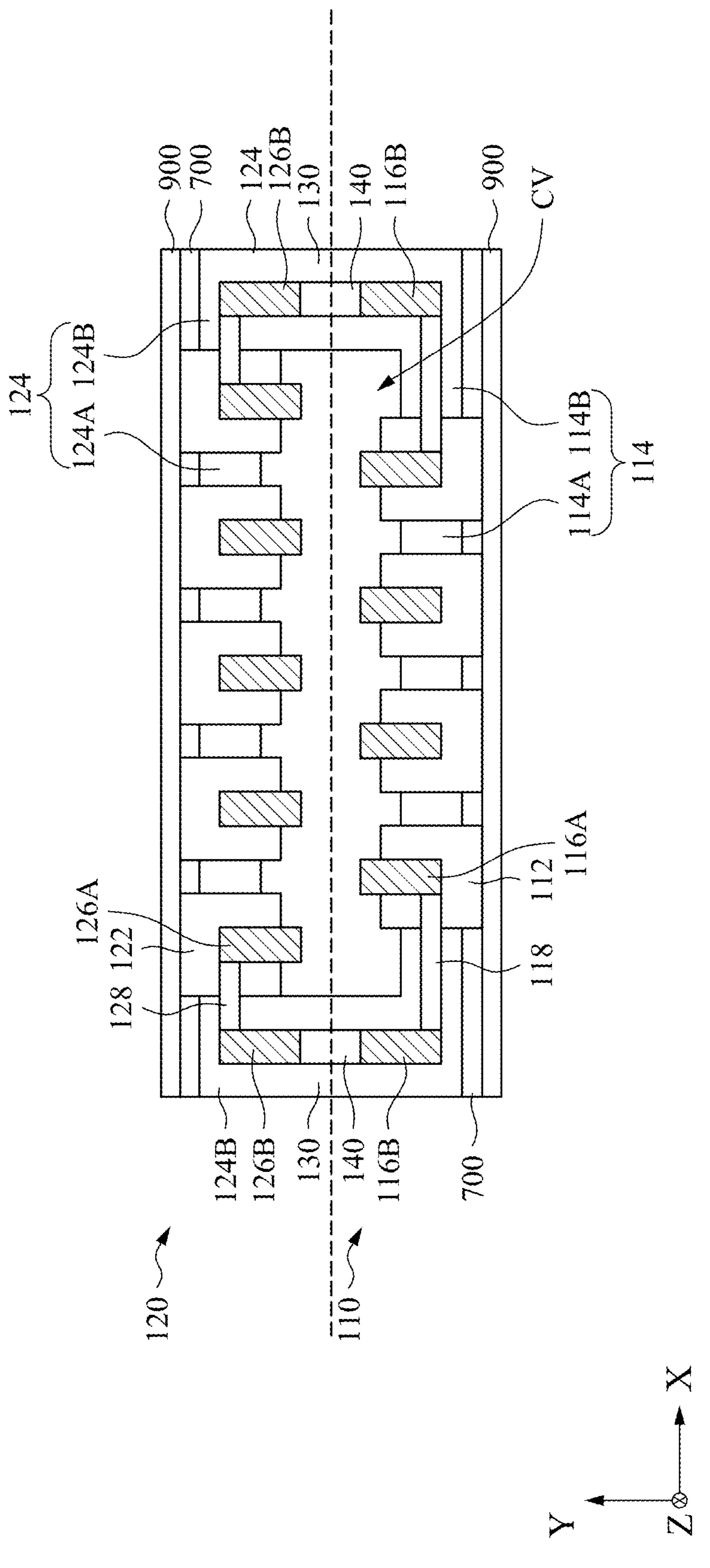

Following, refer to the FIGS. 3 and 4J. The method 200 proceeds to step S300. The stretchable adhesive layer 130 is formed between the insulation extension materials 114 and 124 to join the structures 110 and 120. For example, in the present embodiment, the stretchable adhesive layer 130 is formed between the portion 114B of the insulation extension materials 114 and the portion 124B of the insulation extension materials 124 by a screen printing process, an inkjet printing process, an intaglio printing process, similar printing processes or combination thereof, so that the stretchable adhesive layer 130 is connected to the structures 110 and 120.

Figure 4K:
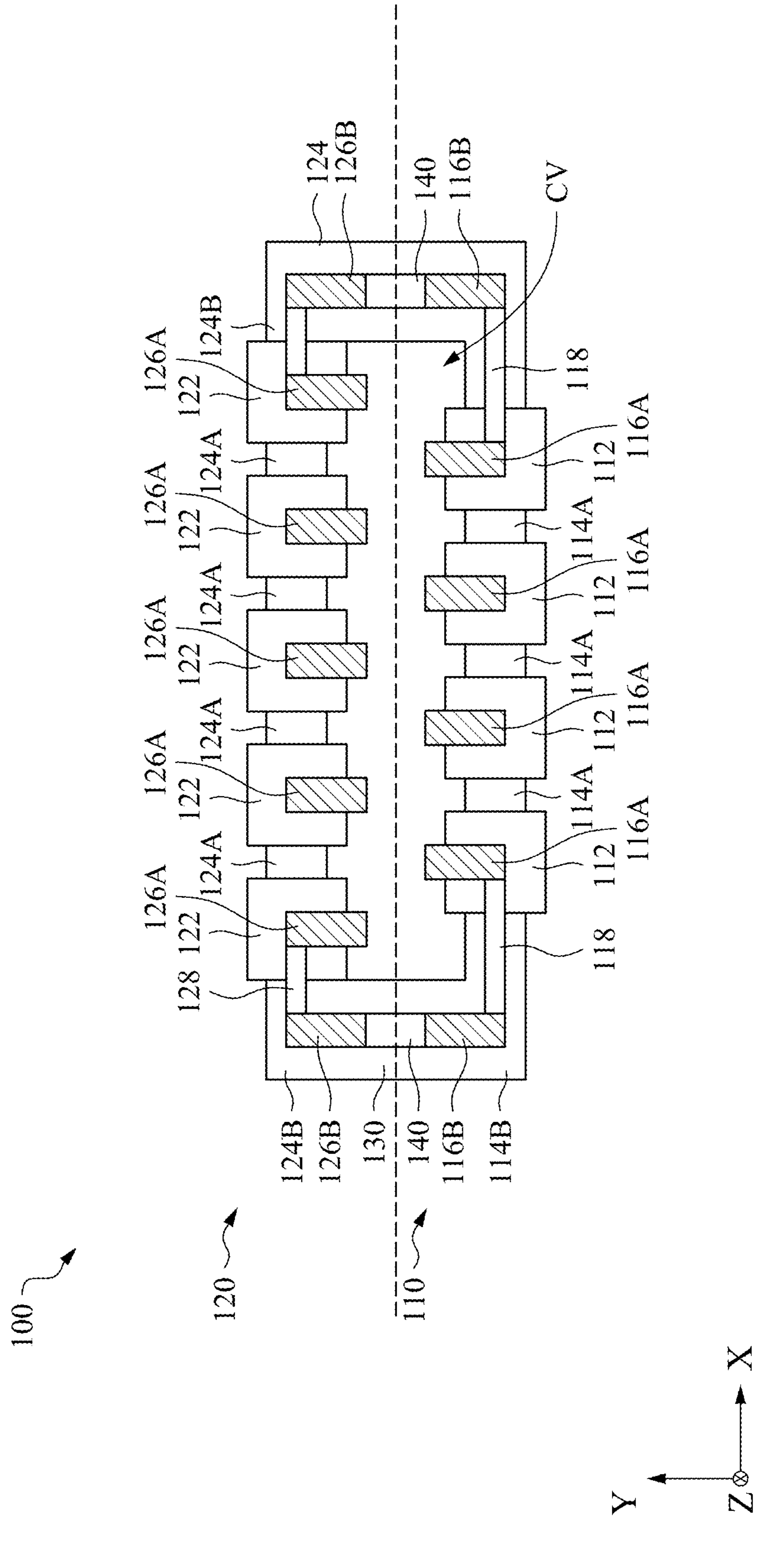

Following, refer to the FIGS. 3 and 4K. The method 200 proceeds to step S310. The sacrificial layer 700 (referring to FIG. 4J) and the conductor layer 900 (referring to FIG. 4J) are removed. For example, in the present embodiment, a chemical etching process, a physical etching process, a composite etching process, similar etching processes or combination thereof may be performed to the conductor layer 900. The sacrificial layer 700 may be removed by the same etching process as the conductor layer 900. In some embodiments, the sacrificial layer 700 may be removed by the process different from the conductor layer 900, such as a laser process.

According to some embodiments of the present disclosure, a bendable circuit board is provided. The bendable circuit board may adopt plural stretchable insulation materials, so that the bendable circuit board may have plural stretchable deformation areas in different directions, thus accordingly deforming the bendable circuit board when the bendable circuit board is subjected to a force. The bendable circuit board may adopt plural conductor materials and plural stretchable metal materials connected to the conductor materials, so that the bendable circuit board may have plural electrical network areas in different directions, thus remaining the electrical connection when the different structures of the bendable circuit board is deformed by the force. Furthermore, the top and bottom structures of the bendable circuit board have a cavity therebetween. By the design of the cavity, the bendable circuit board may have a deformation space and a stress relief space when the bendable circuit board is subjected to forces in different directions. In summary, with the design of the stretchable metal materials, stretchable materials and the cavity, the bendable circuit board has advantages of being resistant to bending and arbitrary deformation. This design improves the tolerance for bending and stretching, so that the bendable circuit board may be used under plural conditions, thus being applied in plural electronic fields.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bendable circuit board, comprising:

a first structure, comprising:

a first insulation layer;

a first insulation extension material surrounding the first insulation layer, wherein an elongation rate of the first insulation extension material is greater than an elongation rate of the first insulation layer;

a first conductive layer comprising a first conductive feature and a second conductive feature, wherein the first conductive feature is inside the first insulation layer, and the second conductive feature is inside the first insulation extension material; and a first conductive extension feature extending along a horizontal direction and connecting the first conductive feature to the second conductive feature, wherein an elongation rate of the first conductive extension feature is greater than an elongation rate of the first conductive layer; and a second structure bonded to the first structure along a vertical direction, wherein the first structure and the second structure have a cavity therebetween, wherein the second structure comprises:

a second insulation layer;

a second insulation extension material surrounding the second insulation layer, wherein an elongation rate of the second insulation extension material is greater than an elongation rate of the second insulation layer;

a second conductive layer comprising a third conductive feature and a fourth conductive feature, wherein the third conductive feature is inside the second insulation layer, and the fourth conductive feature is inside the second insulation extension material; and a second conductive extension feature extending along the horizontal direction and connecting the third conductive feature to the fourth conductive feature, wherein an elongation rate of the second conductive extension feature is greater than an elongation rate of the second conductive layer.

2. The bendable circuit board of claim 1, wherein the first conductive layer comprises a fifth conductive feature inside the first insulation layer, the fifth conductive feature is separated from the first conductive feature, and the fifth conductive feature is electrically disconnected from the second conductive feature.

3. The bendable circuit board of claim 1, further comprising:

a third conductive extension feature extending along the vertical direction and connecting the second conductive feature to the fourth conductive feature, wherein an elongation rate of the third conductive extension feature is greater than the elongation rate of the first conductive layer or the elongation rate of the second conductive layer.

4. The bendable circuit board of claim 1, wherein the first conductive feature of the first conductive layer is misaligned with the third conductive feature of the second conductive layer along the vertical direction.

5. The bendable circuit board of claim 1, wherein the first conductive feature extends beyond a surface of the first insulation layer facing the cavity along the vertical direction.

6. The bendable circuit board of claim 1, wherein the first insulation layer extends beyond a surface of the first insulation extension material facing the cavity along the vertical direction.

7. The bendable circuit board of claim 1, wherein the first insulation layer extends beyond a surface of the first insulation extension material facing away from the cavity along the vertical direction.

8. The bendable circuit board of claim 1, wherein the first conductive extension feature is in direct contact with the first insulation layer and the first insulation extension material.

9. The bendable circuit board of claim 1, wherein the first insulation layer spaces the first insulation extension material apart from the first conductive feature.

10. The bendable circuit board of claim 1, wherein a thickness of the first conductive layer in the vertical direction is greater than a thickness of the first conductive extension feature in the vertical direction.

11. The bendable circuit board of claim 1, wherein the second conductive layer comprises a sixth conductive feature inside the second insulation layer, the sixth conductive feature is spaced apart from the third conductive feature, and the sixth conductive feature is electrically disconnected from the fourth conductive feature.

12. The bendable circuit board of claim 1, wherein the third conductive feature extends beyond a surface of the second insulation layer facing the cavity along the vertical direction.

13. The bendable circuit board of claim 1, wherein the second insulation layer extends beyond a surface of the second insulation extension material facing the cavity along the vertical direction.

14. The bendable circuit board of claim 1, wherein the second insulation layer extends beyond a surface of the second insulation extension material facing away from the cavity along the vertical direction.

15. A bendable circuit board, comprising:

a first structure, comprising:

a first insulation layer;

a first insulation extension material surrounding the first insulation layer, wherein an elongation rate of the first insulation extension material is greater than an elongation rate of the first insulation layer;

a first conductive layer comprising a first conductive feature and a second conductive feature, wherein the first conductive feature is inside the first insulation layer, and the second conductive feature is inside the first insulation extension material; and a first conductive extension feature extending along a horizontal direction, and connecting the first conductive feature to the second conductive feature, wherein an elongation rate of the first conductive extension feature is greater than an elongation rate of the first conductive layer; and a second structure bonded to the first structure along a vertical direction, wherein the first structure and the second structure have a cavity therebetween, wherein the second structure comprises:

a second insulation layer;

a second insulation extension material surrounding the second insulation layer, wherein an elongation rate of the second insulation extension material is greater than an elongation rate of the second insulation layer;

a second conductive layer comprising a third conductive feature and a fourth conductive feature, wherein the third conductive feature is inside the second insulation layer, and the fourth conductive feature is inside the second insulation extension material; and a second conductive extension feature extending along the horizontal direction, and connecting the third conductive feature to the fourth conductive feature, wherein an elongation rate of the second conductive extension feature is greater than an elongation rate of the second conductive layer; and a third conductive extension feature extending along the vertical direction and connecting the second conductive feature to the fourth conductive feature.

* * * * *